United States Patent [19]

Diffenderfer et al.

[11] Patent Number: 5,406,285
[45] Date of Patent: Apr. 11, 1995

[54] DIGITAL-TO-ANALOG CONVERTER

[75] Inventors: Jan C. Diffenderfer, San Diego; Joseph H. Colles, Bonsall, both of Calif.

[73] Assignee: Brooktree Corporation, San Diego, Calif.

[21] Appl. No.: 23,359

[22] Filed: Feb. 26, 1993

[51] Int. Cl.⁶ .............................................. H03M 1/80
[52] U.S. Cl. ..................................... 341/144; 341/153
[58] Field of Search ................................. 341/144, 153

[56] References Cited

U.S. PATENT DOCUMENTS

3,995,304 11/1976 Pease ............................ 340/347 DA
4,695,826 9/1987 Ando et al. .................. 340/347 DA
4,782,323 11/1988 Lucas .................................. 341/150

Primary Examiner—Howard L. Williams
Attorney, Agent, or Firm—Ellsworth R. Roston; Charles H. Schwartz

[57] ABSTRACT

A system on an integrated circuit chip for providing a digital-to-analog conversion includes a plurality of output members each providing a particular current when energized. These members may be disposed on the chip in a pair of spaced columns. First control lines in the space between the columns of output members provide a thermometer code. Second control lines in this space provide a binary code. The first and second control lines are preferably parallel to the columns. When a first one of the first control lines is energized, different ones or combinations of the second control lines provide progressive values in the output members between "0" and "15", assuming four (4) of the second control lines. Similarly, when a second one of the first control lines is additionally energized, different ones or combinations of the second control lines provide progressive values between "16" and "31" in associated output members. At the same time, the output members providing a value of "15" continue to be energized. Similarly, the energizing of successive ones of the first control lines provides for the generation of analog values within progressive ranges. The output members associated with each of the first control lines are interspersed in the columns in accordance with the analog values represented by these output members to provide a first centroidal arrangement. The output members associated with each of the first control lines are also interspersed with the output members associated with the others of the first control lines to provide a second centroidal arrangement.

23 Claims, 5 Drawing Sheets

| CONTROL LINE 38a | CONTROL LINE 38b | CONTROL LINE 38c | CONTROL LINE 38d | COUNT |
|---|---|---|---|---|
| 0 | 0 | 0 | 0 | 0 |
| 1 | 0 | 0 | 0 | 1 |
| 0 | 1 | 0 | 0 | 2 |
| 1 | 1 | 0 | 0 | 3 |
| 0 | 0 | 1 | 0 | 4 |
| 1 | 0 | 1 | 0 | 5 |
| 0 | 1 | 1 | 0 | 6 |
| 1 | 1 | 1 | 0 | 7 |
| 0 | 0 | 0 | 1 | 8 |
| 1 | 0 | 0 | 1 | 9 |
| 0 | 1 | 0 | 1 | 10 |
| 1 | 1 | 0 | 1 | 11 |
| 0 | 0 | 1 | 1 | 12 |
| 1 | 0 | 1 | 1 | 13 |
| 0 | 1 | 1 | 1 | 14 |
| 1 | 1 | 1 | 1 | 15 |

FIG. 5

DIGITAL-TO-ANALOG CONVERTER

This invention relates to digital-to-analog converters. More particularly, this invention relates to digital-to-analog converters which are monotonic and have low differential and integral non-linearities and which are instantaneously responsive to changes in the digital value.

In control systems, the values of different parameters such as temperature and pressure are provided on an analog basis. These parameters are regulated to control the values of other parameters in the system. For example, the temperature of a cutting member and the force exerted by the cutting member on a workpiece may be used to regulate the rate at which a cut is being made by the cutting member in the workpiece. In order to provide such a regulation, the values of the parameters such as temperature and force and the characteristics of the cut have to be converted from analog values to digital values.

Computations have then to be made by a digital computer or data processing system such as a microprocessor to determine the values of the parameters, such as temperature and force, which are required to provide the cut with the desired characteristics. The digital values of these parameters are then converted to analog values to regulate the values of such parameters. As the accuracy required for such regulations has increased, the number of binary bits representing each parameter such as temperature and force has increased. Furthermore, the frequency of making each conversion between digital and analog values has increased.

As another example, colors to be displayed on a video screen are provided in digital form in a personal computer or workstation. The digital values are then converted to an analog form and the colors are displayed on the video screen in the analog form. As the personal computers and workstations become progressively sophisticated, the colors have to be displayed on the video screen with increased accuracy and resolution. This has required the color of each pixel on the video screen to be indicated by an increased number of binary bits. Furthermore, as the number of pixel positions on the screen increases to provide an enhanced resolution of the image on the video screen, the frequency of the conversion of the digital information to analog values becomes progressively increased.

The digital-to-analog converters now in use generally operate on the same basis. They include a first unit which operates on binary bits of low binary significance to provide an analog signal representative of such binary bits. For example, a unit operating on four (4) binary bits of least binary significance may provide analog values between "0" and "15". Every time that an analog value of "15" is reached in such unit and a binary increment is then introduced to the unit, an overflow is produced and the count in the unit is then returned to an analog value of "0". The overflow then energizes a member which has a binary significance greater than the binary significance of the four (4) binary bits in the unit.

Although digital-to-analog converters as discussed in the previous paragraphs are advantageous in minimizing the number of components in the converter, they also have certain disadvantages. One disadvantage is that the initial count in the unit of low binary significance and then the overflows to the members of increased binary significance limit linearity of the converter. This results from the fact that the output members energized from the overflows may not have characteristics matching the units of low binary significance that produce the overflows when a full count in such units has been provided.

The disadvantages of the converters now in use have been understood for some time. It has also been understood that these disadvantages have become aggravated as the frequency requirements have increased and as the requirements for increased resolution in the color response have increased. In spite of these disadvantages and in spite of a considerable effort to provide a converter which overcomes these disadvantages, the converters of the prior art are still in use.

This invention provides a converter which overcomes the disadvantages described above. The converters of this invention provide for the energizing of the output members in a combination of thermometer and binary codes. By providing such an arrangement, accurate conversions of binary values to analog values through a wide range of values can be provided. The converter of this invention also minimizes any error in the analog output by unique centroiding techniques.

In one embodiment of the invention, a system on an integrated circuit chip for providing a digital-to-analog conversion includes a plurality of output members each providing a particular current when energized. These members may be disposed on the chip in a pair of spaced columns. First control lines in the space between the columns of output members provide a thermometer code. Second control lines in this space provide a binary code. The first and second control lines are preferably parallel to the columns.

When a first one of the first control lines is additionally energized, different ones or combinations of the second control lines provide progressive values in the output members between "0" and "15", assuming that there are four (4) of the second control lines. Similarly, when a second one of the first control lines is energized, different ones or combinations of the second control lines provide progressive values between "16" and "31" in associated output members. At the same time, the output members providing a value of "15" continue to be energized. Similarly, the energizing of successive ones of the first control lines provides for the generation of analog values within progressive ranges.

The output members associated with each of the first control lines are interspersed in the columns in accordance with the analog values represented by these output members to provide a first centroidal arrangement. The output members associated with each of the first control lines are also interspersed with the output members associated with the others of the first control lines to provide a second centroidal arrangement.

Figure 1:
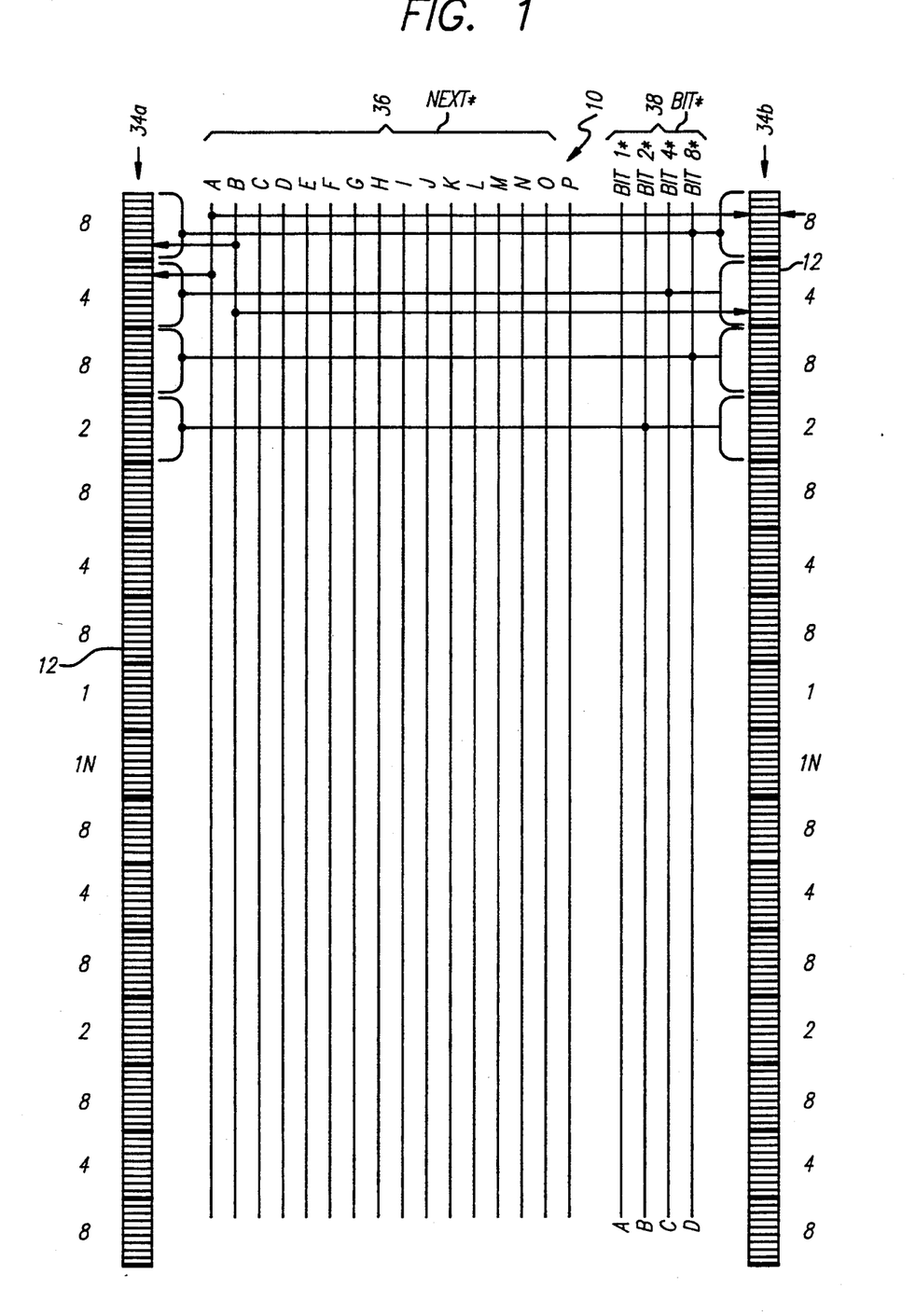
FIG. 1 is a schematic diagram, partly in block form, of a digital-to-analog converter forming one embodiment of the invention, the converter including a plurality of current cells (or output members) disposed in a particular relationship to provide a centroiding for minimizing errors in the converter.

In one embodiment of the invention, a digital-to-analog converter generally indicated at 10 is provided in FIG. 1. The converter 10 includes a plurality of output members 12 each of which is constructed to produce a signal of substantially constant characteristics. For example, each of the output members 12 may be constructed to provide a constant increment of current or a constant increment of voltage. In one embodiment, each output member may constitute a current source and may be constructed as disclosed and claimed in U.S. Pat. No. 4,831,282 issued to me on May 16, 1989, for "CMOS Input Circuit" and assigned of record to the assignee of record of this application.

Figure 2:
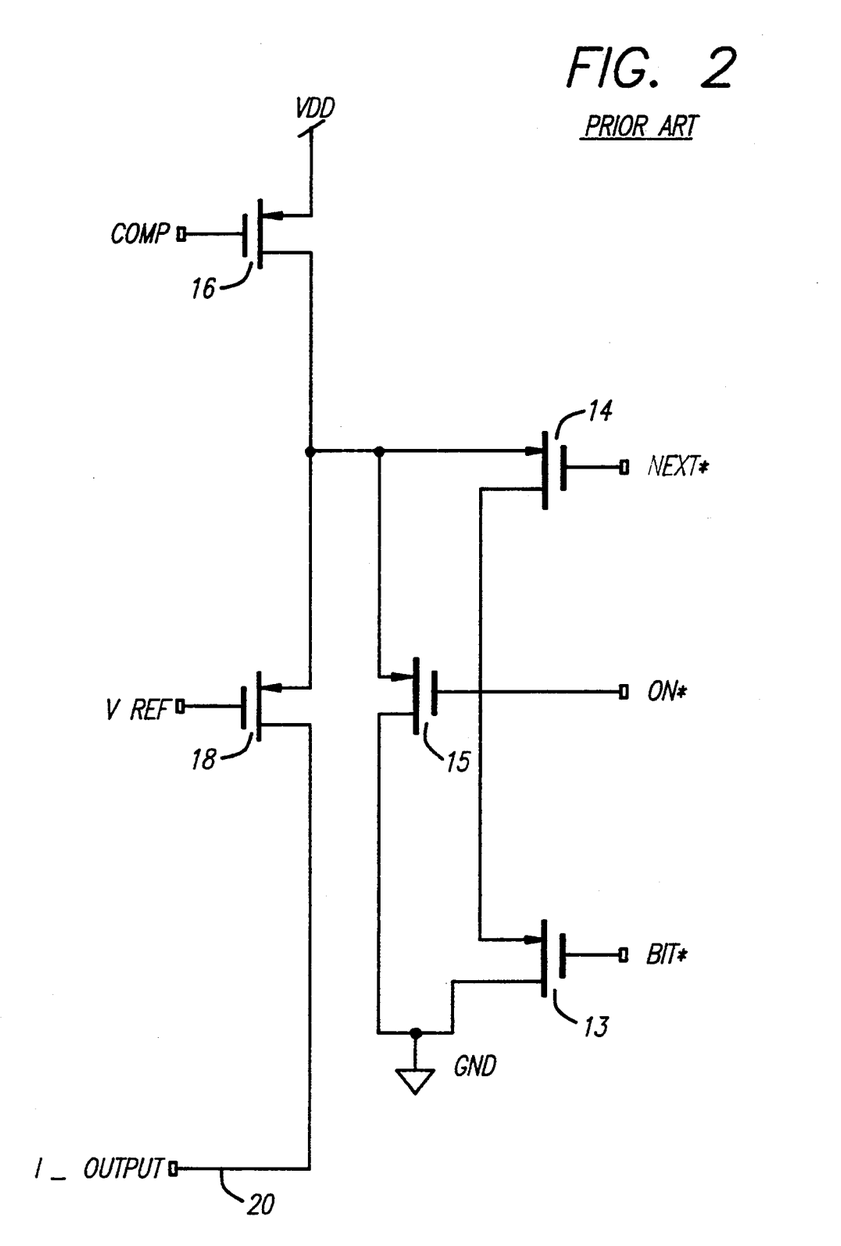
FIG. 2 is a circuit diagram of one of the current cells (or output members) shown in block form in FIG. 1.

The constant current source of U.S. Pat. No. 4,831,282 is shown in FIG. 2. It includes several CMOS transistors all of the p-channel type. The gate of a transistor 13 receives a binary input signal having a high amplitude level and a low amplitude level. This input signal indicates the value of a particular bit in a group of individual binary significance in accordance with the amplitude level of the input signal. This signal is designated as "BIT*" in FIG. 2, the "*" indicating a low amplitude level. The signal "BIT*" may be obtained from an individual one of the lines "BIT 1*" through "Bit 4*". These lines are collectively designated at 38 in FIG. 1.

A signal representing "NEXT *" is introduced to the gate of a transistor 14 in FIG. 2, the "*" indicating a signal of low amplitude. The "NEXT*" signal is obtained from one of the lines 36 respectively designated as "NEXT *" in FIG. 1. The gate of the transistor 15 receives a "ON*" signal. This signal is received by a current cell of reduced binary significance from the group of output members of the next higher significance to be energized.

The gate of the transistor 16 receives a substantially constant bias voltage (designated as "COMP") to provide for the flow of a substantially constant current through the transistor 16 and either a transistor 18 or one of the paths defined by the transistors 13, 14 and 15. The gate of the transistor 18 receives a substantially constant bias voltage (designated as VREF) to bias the transistor to a state of conductivity. The sources of the transistors 14, 15 and 18 and the drain of the transistor 16 have a common connection.

There are three different cases in FIG. 2. In one case, when the "ON*" signal introduced to the gate of the transistor 15 has a low amplitude and the signal (NEXT*) introduced to the gate of the transistor 14 has a low amplitude, the output on the line 20 is low. This results from the flow of current through the transistor 15 to drive the source of the transistor 18 to ground.

In another case, when the signal introduced to the gate of the transistor 15 has a high amplitude and the signal introduced to the gate of the transistor 14 has a low amplitude, the output on the line 20 is dependent upon the amplitude of the signal introduced to the gate of the transistor 13. When the amplitude of the signal introduced to the gate of the transistor 13 under such circumstances is low, an output signal does not appear on the drain of the transistor 18 because the source of the transistor is substantially at ground.

In the third case, when the voltage on the gate of the transistor 15 is high and the voltage on the gate of the transistor 14 is high, an output current is produced in the output line 20 regardless of the amplitude of the voltage on the gate of the transistor 13. This results from the production of a high voltage on the source of the transistor 18 to make the transistor conductive.

The current source formed by the transistors 13, 14, 15, 16 and 18 responds quickly to changes in the input signals on the gates of the transistors 13, 14 and 15 to produce a corresponding output on a line 20 extending from the drain of the transistor 18. The response of the transistor 18 is expedited by the distributed capacitances in the transistors 13 and 14 or in the transistor 15, the expediting being provided primarily by the distributed capacitances between the sources and gates of the transistor 13 and 14 or the transistor 15. The distributed capacitances between the sources and gates of the transistors 13 and 14 or the transistor 15 are also instrumental in obtaining the production of an output signal without any glitch on the output line 20 of the transistor 18.

U.S. Pat. No. 4,831,282 also discloses and claims a servo feedback loop for use with the current source formed by the transistors 13, 14, 15, 16 and 18. This servo feedback loop regulates the operation of each current source to assure that the output on the drain of the transistor 18 will be glitch-free and will have a constant amplitude. The servo feedback loop includes an operational amplifier 22 (FIG. 3) and a pair of transistors 24 and 26, preferably of the p-channel type, connected in a cascode arrangement. The servo feedback loop regulates the operation of a plurality of current cells. Two (2) current cell are illustratively shown in FIG. 3. These are the current cells formed by transistors 13a, 14a, 15a, 16a and 18a and the current cell formed by transistors 13b, 14b, 15b, 16b and 18b.

Figure 3:
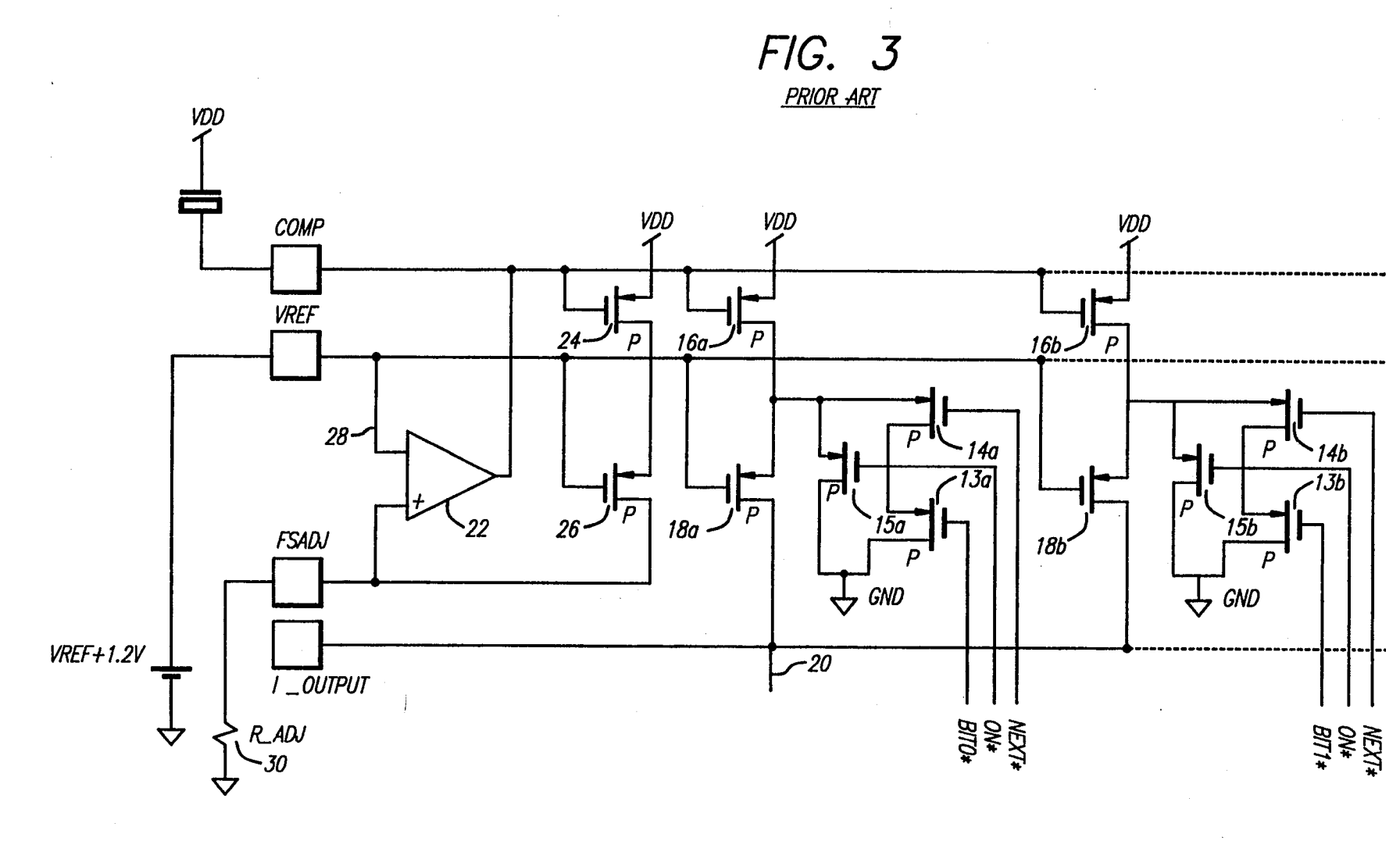
FIG. 3 is a circuit diagram of a pair of the current cells (or output members) shown in FIG. 2 and of a servo feedback loop associated with such current cells to regulate the current through such current cells.

The operational amplifier 22 has two (2) inputs, one for receiving a reference voltage (VREF) such as approximately +1.2 volts on a line 28 and a second input variable in accordance with the voltage across a resistance 30. The reference voltage such as +1.2 volts on the line 28 is introduced to the gates of the transistors 18a and 18b to regulate the operation of these transistors so that no glitch will be produced on the drains of the transistors. The output from the operational amplifier 22 is introduced to the gates of the transistors 16a and 16b to assure that the current flowing through these transistors and either the transistors 13 and 14, the transistors 15 or the transistors 18 will be substantially constant.

In this way, the servo feedback loop defined in part by the operational amplifier 22 and the transistors 24 and 26 regulates the operation of each of the current sources such as the current source formed by the transistors 13a, 14a, 15a, 16a and 18a or the current source formed by the transistors 13b, 14b, 15b, 16b and 18b. As a result of this regulation, a substantially constant current flows through the transistor 18 in each current source without any glitch even at high frequencies such as two hundred megahertz (200 mHz) to indicate a binary "1" in such current source. The output currents through the transistors such as the transistors 18a and 18b are accumulated on the output line 20.

A plurality of current sources, each formed by transistors corresponding to the transistors 13, 14, 15, 16 and 18, may be provided each constituting one of the output members 12 in the plurality shown in FIG. 1. The drains of the output transistors (corresponding to the transistor 18) are connected to the output line 20 so that the current through the output line 20 at each instant represents the analog value corresponding to the digital value to be converted at that instant. The operation of all of the current sources 12 may be regulated by the single feedback loop including the operational amplifier 22 and the transistors 24 and 26 connected in the cascode arrangement. This regulation may be provided by connecting the gates of all of the output transistors corresponding to the transistor 18 to the reference voltage line 28 and by connecting the gates of all of the current transistors 16 to the output of the operational amplifier 22. By regulating the operation of all of the current sources from a single feedback loop, all of the different current sources are able to provide the same output current to the output line 20 when these current sources are energized.

Figure 4:
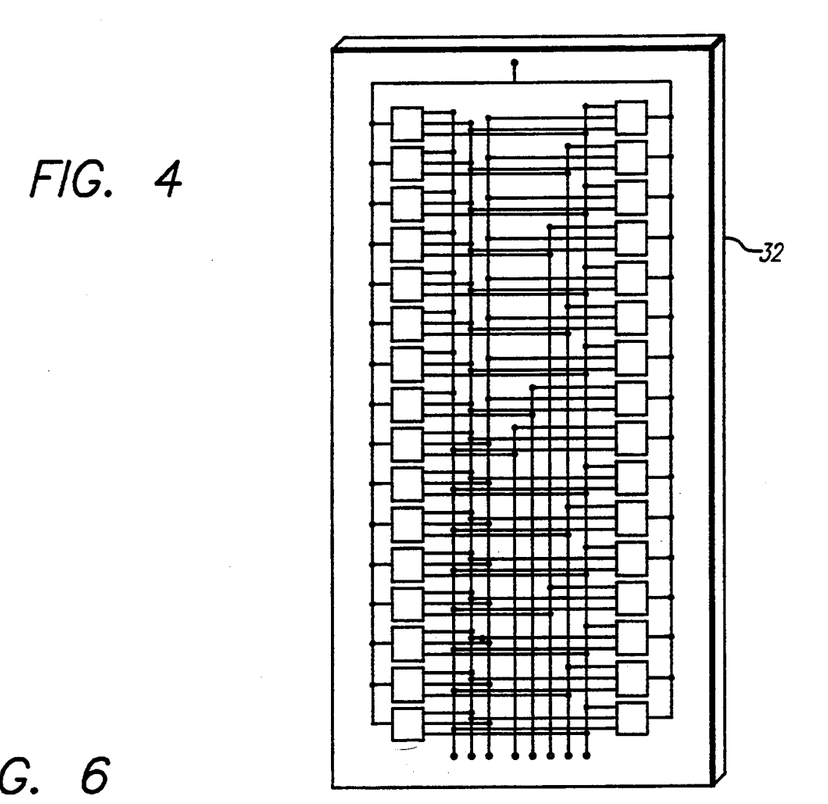
FIG. 4 is a schematic perspective view of an integrated circuit chip on which the converter shown in FIGS. 1–3 is incorporated.
Figure 5:
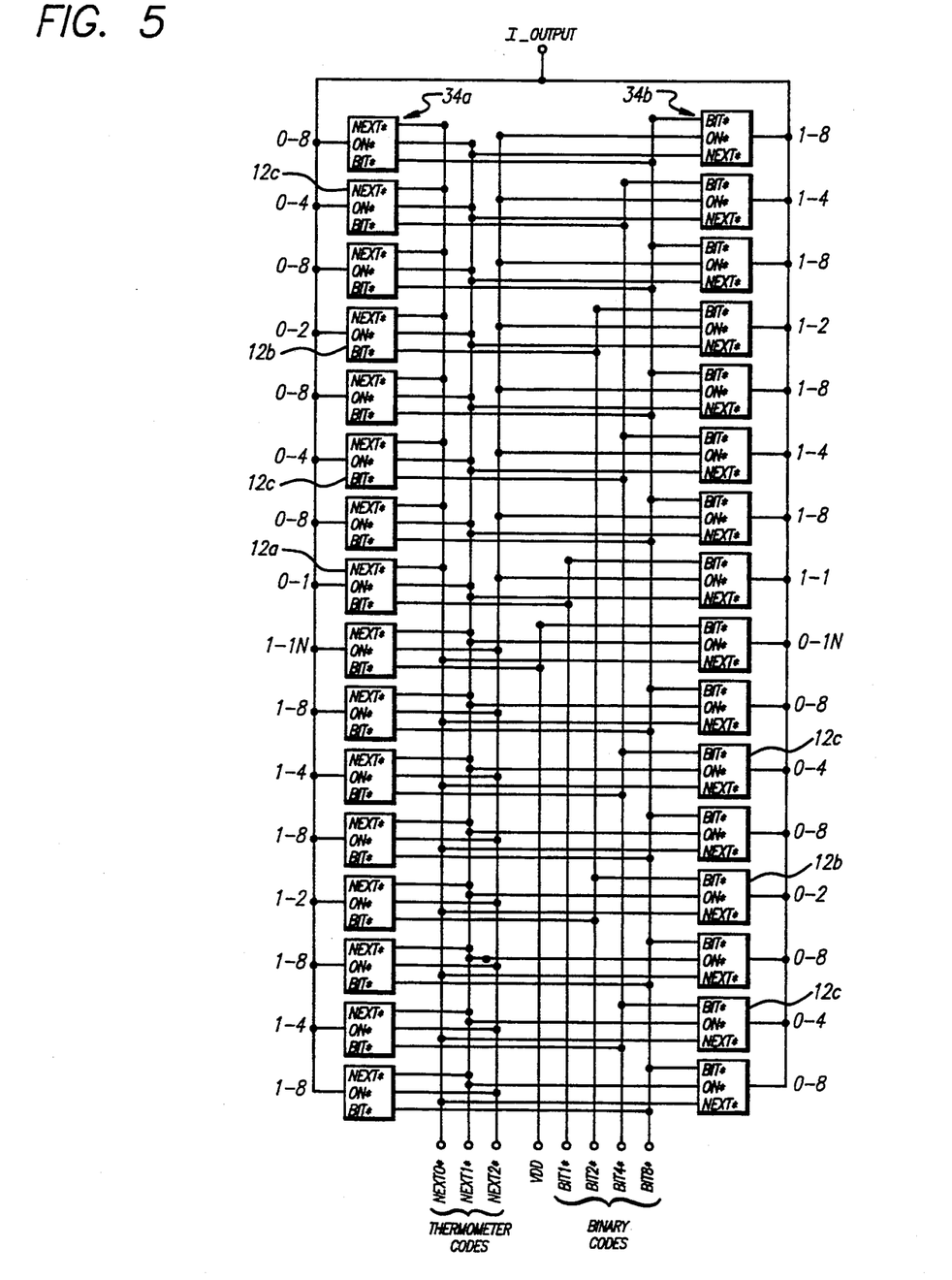
FIG. 5 is a schematic diagram, partly in block form, showing the connections to the different current cells (or output members) also shown in FIG. 1.

The output members (or current cells) 12 are disposed on an integrated circuit chip 32 (FIG. 4). Preferably the output members 12 are disposed on the chip 32 in a pair of spaced columns, generally indicated at 34a and 34b in FIGS. 1 and 5, extending in a particular direction such as a longitudinal direction. The control lines 36 are disposed between the columns 34a and 34b. Any particular number such as sixteen (16) different lines 36 may be disposed between the column 34a and 34b and may be respectively designated as "NEXT 0*", "NEXT 1*", "NEXT 2*", etc. In FIG. 1, sixteen (16) different control lines 36 are shown to provide a thermometer count. Such control lines are respectively designated in FIG. 1 by the successive alphabetical letters "A-P." Each of the control lines 36 preferably extends the length of the columns 34a and 34b so that each of the control lines 36 can be coupled to individual lines of the output members 12 disposed at different positions along the lengths of the columns 34a and 34b. In FIG. 5, only three (3) of the control lines 36 are shown for purposes of simplicity.

Figure 6:
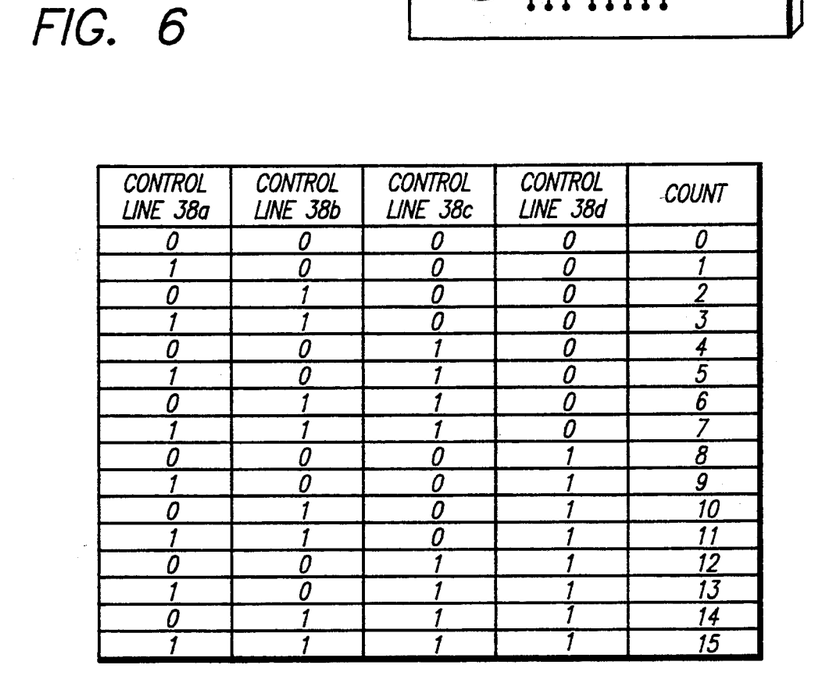
FIG. 6 shows a chart specifying the logic for energizing the current cells (or output members) in the converter shown in FIGS. 1–4.

The control lines 38 in the second group are disposed between the columns 34a and 34b in a spaced and parallel relationship to the control lines 36 in the first group. By way of illustration, four (4) control lines 38 may be disposed in the second group and may be energized on a binary basis to provide for fifteen (15) different selections. The control lines are respectively designated as "BIT 1*", "BIT 2*", "BIT 4*" and "BIT 8*" to indicate the binary significance of the control lines. The fifteen (15) different selections represented by the individual combinations of activation of the control lines 38A-38D with patterns of binary "1" and binary "0" are shown in FIG. 6. They correspond to a well-known binary count between analog values of "1" and "15".

Different combinations of the control lines 36 and 38 activate selective groups of the output members 12 so that individual ones of the output members can be energized. The control lines 36 operate on a thermometer basis. The control lines 38 operate on a binary basis to extend the range of each individual one of the control lines 36 when such individual one of the control lines 36 is energized. For example, when the control line 36A is energized, the control lines 38 provide for individual ones of sixteen (16) different selections in a range of values between "0" and "15". Similarly, when the control line 36B is energized, the control lines 38 provide for individual ones of sixteen (16) different selections in a range of values between "16" and "31".

As will be seen, the sixteen (16) different selections provided by the combination of the control line 36A and the control lines 38 occur in a different range of values than the sixteen (16) different selections provided by the combination of the control line 36B and the control lines 38. In like manner, the progressive energizing of each of the control lines 36C–36P provides for the selection of values in progressively increased ranges. It will be appreciated that any given number of control lines 36 and any given number of control lines 38 may be provided to expand to any desired level the number of different selections which can be made.

Groups of the output members 12 may be associated with each individual combination of the control lines 36 and the control lines 38. For example, individual ones of the output members 12 may be associated with each individual combination of the control lines 36A and 38. When both of the control lines 36A and 38A are simultaneously energized, the transistors 13 and 14 in an individual one of the output members (or current cells) 12 become simultaneously cut off. A current accordingly flows through the output transistor 18 in such output member 12 to the output line 20.

The sixteen (16) output members 12 associated with the combinations of one of the control lines 36 and the control lines 38 have an individual range of values. For example, the combination of the control line 36A and the control lines 38 may occur in a range between "0" and "15". Specifically, when the control lines 36A and 38A are simultaneously energized, a signal passes through the output transistor 18a in the output member 12a (FIGS. 3 and 5) to produce on the output line 20 a current having a magnitude representing the Arabian integer "1". The output member 18a is designated as 0-1 in FIG. 5.

Similarly, when the control lines 36A and 38B are simultaneously energized, currents representing the integer "2" simultaneously pass through the output transistors 18b and 18c in the two (2) output members 12b (FIGS. 3 and 5) to the output line 20. The output members 12b are designated as "0-2" in FIG. 5. In like manner, simultaneously energizing the control lines 36A, 38A and 38B provides for an indication on the output line 20 of the Arabian integer "3" by providing for the passage of current to the line 20 through the output member 12a and the two (2) output members 12b. In like manner, simultaneously energizing the control lines 36A and 38C provides for an indication on the output line 20 of the Arabian integer "4" by simultaneously providing for the passage of current to the line 20 through the four (4) output members 12C. The output members 12c are designated as 0-4 in FIG. 5. In accordance with an extension of the binary code, simultaneously energizing the control lines 36A, 38A, 38B, 38C and 38D provides for the production on the output line 20 of a cumulative current having a magnitude to represent the Arabian integer "15". This constitutes an accumulation of currents through the output members 12a, 12b and 12c and the eight (8) output members designated as 0-8 in FIG. 5.

Successive combinations of the control lines 36 and 38 represent individual ranges of Arabian integers. For example, a combination of the control line 36B and the control lines 38 may represent a range of Arabian integers between "16" and "31" and a combination of the control line 36C and the control lines 38 may represent Arabian integers between "32" and "47". It will be seen that the number of Arabian integers may be expanded on a recursive basis to any desired value by varying the number of control lines 36 and the number of control lines 38. It will also be seen that a group of output members representing the analog value "15" continues to be energized as the analog value continues to increase above the analog value "15".

As previously described, the characteristics of the output members 12 may not be identical at different positions on the integrated circuit chip 32. This may result from progressive deviations in the manufacturing process at successive positions on the chip. For example, the thickness of individual layers, whether electrically insulating or electrically conductive, at progressive positions on the chip may affect the magnitude of the current through the output members 12 located at these progressive positions on the chip.

To minimize the differential and integral non-linearities in the current in the output line 20 for progressive increases in the value being converted, centroidal arrangements may be provided for the output members 12. These centroidal arrangements may be provided for each group of output members 12 such as occurs when the control line 36A is energized and individual combinations of the control lines 38 are energized to provide an output indication in a range of values between "0" and "15".

The output members 12 are disposed in centroidal arrangements to minimize any differential and integral non-linearities on the chip. The centroidal relationship is provided with respect to the output members 12 associated with each individual one of the control lines 36. For example, the output members indicating Arabian values in a range between "0" and "15" are disposed in a centroidal arrangement to minimize any differential and integral non-linearities. This may be seen from FIG. 5. In FIG. 5, the output member 0-1 is disposed at the center of the left column. The output members 0-2 are disposed in a symmetrical relationship in the left and right columns. In other words, the output member 0-2 in the left column is disposed as far from the top of the left column as the output member 0-2 is disposed from the bottom of the right column. Similarly, the output members 0-4 are disposed in a symmetrical and interleaved relationship with the output members 0-1 and 0-2 in the left and right columns. In like manner, the output members 0-8 are disposed in a symmetrical and interleaved relationship in the left and right columns with the output members 0-1, 0-2 and 0-4.

The output members 12 associated with each of the control lines 36 are also disposed in a centroidal relationship with respect to the output members associated with the other control lines 36 to minimize differential and integral non-linearities. For example, the output members for the analog values in the range between "16" and "31" are designated as 1-1, 1-2, 1-4 and 1-8 to correspond to the designations of 0-1, 0-2, 0-4 and 0-8 for the output members providing indications of analog values in the range between "0" and "15". As will be seen, the output members 1-1, 1-2, 1-4 and 1-8 have a symmetrical and interleaved relationship corresponding to the symmetrical and interleaved relationship for the output members 0-1, 0-2, 0-4 and 0-8. However, whereas the output members 0-1, 0-2, 0-4 and 0-8 are disposed in the upper left column and the lower right column, the output members 1-1, 1-2, 1-4 and 1-8 are disposed in the lower left column and the upper right column. This provides a balance between the disposition of the output members 0-1, 0-2, 0-4 and 0-8 and the output members 1-1, 1-2, 1-4 and 1-8. It will be seen that additional groups of output members may be symmetrically interleaved with the output members shown in FIG. 6 to extend the range of output indications.

By providing centroidal relationships for the output members 12 associated with each of the control lines 36 and for such output members associated with such control relative to the output members associated with the other control line 36, errors in a number of orders of magnitudes are minimized. The first order effect of errors results from progressive deviations in a particular magnitudinal direction (e.g. an increase in current in progressive output members) across the dimensions of the chip. These deviations may result illustratively from progressive changes in the thickness of a layer (or layers) on the chip. The second order effect results from a progressive deviation in one magnitudinal direction (e.g. current increase) and then in an opposite magnitudinal (e.g. current decrease) in progressive output members in a particular direction across the dimensions of the chip. A third order effect results from a progressive magnitudinal deviation (e.g. current increase) in one direction and then in an opposite magnitudinal direction (e.g. current decrease) and then in the first magnitudinal direction (e.g. current increase) and then in the opposite magnitudinal direction (e.g. current decrease) in progressive output members in a particular direction across the dimensions of the chip.

The output members 12 in the column 34a have numerical designations to the left of these output members in FIG. 5 and the output members 12 in the column 34b have numerical designations to the right of these output members in FIG. 5. These designations provide a code indicating the significance of the output members. For example, a number of the output members are designated as "0-8". This indicates that these output members are energized by a combination of signals on the line designated as "Next 0*" in FIG. 6 and the line designated as "Bit 8*" in FIG. 6. The signal from the "Next 0*" line is introduced to the terminal designated as "Next*" in the blocks designated as "0-8". The signal from the line "Bit 1*" is introduced to the terminal designated as "Bit*" in the blocks designated as "0-8". As will be seen, the terminals designated as "Bit *" and "Next *" constitute the gates of the transistors 13 and 14 in the detailed circuit diagram of the output member (or current cell) shown in FIG. 3.

The output members 12 shown in FIG. 1 are connected in a centroidal arrangement. For example, half of the output members responsive to the signal on the "NEXT 1" line are disposed at the upper end of the column 34a and THE other half are disposed at the lower end of the column 34b. Furthermore, the "0-1" output member is slightly above mid-level position in the column 34a. The output member 12 designated as "0-IN" is slightly below the mid level position in the column 34b. This output member becomes "energized" when the count advances from "15" to "16". This occurs when the "Code 1" line is energized and the $V_{DD}$ energizing voltage is introduced to the "BIT *" terminal in the "0-IN" output member.

The "0-2" output members are respectively disposed midway between the "0-1" output member and the top of the column 34a and between the "0-1N" output member and the bottom of the column 34b. This provides a symmetrical relationship between the "0-2" output members on the one hand and the "0-1" and "IN" output members on the other hand.

Similarly, the "0-4" output members are disposed in a symmetrical and interleaved relationship with respect to the output members discussed above. Two (2) of the "0-4" output members are respectively disposed in the column 34a halfway between the top of the column 34a and the "0-2" output member and halfway between the "0-2" output member and the "0-1" output member. The other two (2) of the "0-4" output members are respectively disposed halfway in the column 34A between the top of the column and the "0-2" output member and halfway between the "0-2" output member and the "0-1" output member. The other two (2) of the "0-4" output members are respectively disposed in the column 34b halfway between the "0-IN" output member and the "0-2" output member and halfway between the 0-2 output member and the bottom of the column 34b. The "0-8" output members are interleaved between the other output members discussed above so that each of the "0-8" output members is separated from the adjacent "0-8" output members by one of the 0-1, 0-2 and 0-4 output members.

In like manner, each of the output members 12 designated by a prefix of "1" (e.g. "1-4 or "1-8") has its "Next *" terminal connected to the line designated as "Next 1*". These output members are disposed in the lower half of the column 34a and in the upper half of the column 34b in a symmetrical and interleaved relationship with respect to one another and with respect to the output members discussed in the previous paragraphs. The respective "NEXT *" and "BIT *" terminals in the "1-1N" output member 12 are respectively converted to the NEXT *" line (corresponding to the line 36B) and the "$V_{DD}$" line.

The "Next *" line corresponding to the line 36B is connected to the terminals designated as "ON *" in the output members having the prefix "0" (e.g. "0-8"). This terminal corresponds to the gate of the transistor 15 in FIG. 3. It provides for the energizing of the output members designated by the prefix "0" (e.g. "0-8") when the "Next *" line corresponding to the line 36B is energized. In like manner, the signal on the "Next *" line corresponding to the line 36C is introduced to the "On *" terminals in the output members with the prefix "1" (e.g. "1-8") when this line is energized.

When a signal is introduced to the "On *" terminal of an output member, the transistor 15 (FIG. 2) in that output member becomes non-conductive so that a current passes through the output transistor 18 in that output member to the output line 20. Thus, all of the output members 12 having a "0" prefix (e.g. "0-8") are energized when the "NEXT *" line corresponding to the line 3B is energized. Similarly, all of the output members having a "1" prefix (e.g. "1-8") are energized when the "NEXT *" line corresponding to the line 38C is energized.

It will be appreciated that the embodiment shown in FIG. 5 is limited to an arrangement which provides a count in a range between "0" and "31". It is believed that a person of ordinary skill in the art will know how to expand the arrangement shown in FIG. 5 to a number of output members providing any desired count.

As will be seen, all of the output members 12 in the group "0" prefix (e.g. "0-8") are disposed in the columns 34a and 34b so that the output members of progressive binary significance are disposed in a balanced or symmetrical relationship with the output members of reduced binary significance in that group. Furthermore, half of the output members 12 in the group with the "0" prefix are disposed in the column 34a in a balanced or symmetrical relationship with the other half of the output members in the group with the "0" prefix in the column 34b.

Similarly, all of the output members 12 in the group with a "1" prefix (e.g. "1-8") are disposed in the same relationship with respect to one another as the output members with the "0" prefix. However, the disposition of the output members 12 in the group with the "0" prefix are inverted with respect to the output members in the group with the "0" prefix to provide a centroidal relationship between the output members in the two (2) groups.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for providing a conversion between digital and analog values,
   a plurality of output members each constructed to be energized to provide a particular current, the output members being disposed in a pair of spaced columns,
   a plurality of control lines individual combinations of which control the selection of individual ones of the output members in accordance with the digital value to be converted to the analog value, the control lines being disposed between the output members in a columnar relationship with the output members, the control lines being disposed in first and second groups each providing a representation different from the other,
   means for coupling individual ones of the output members to individual combinations of the control lines in the first and second groups,
   means responsive to the digital value for energizing the individual combinations of the control lines representative in the first and second groups of such digital value, and
   means responsive to the energizing of the individual combinations of the control lines for selectively energizing the individual ones of the output members coupled to such individual combinations of the control lines.

2. In a combination as set forth in claim 1,
   the control lines in the first group being disposed to provide a thermometer relationship in the count of binary values and the control lines in the second group being disposed to provide a binary relationship in such count.

3. In a combination as set forth in claim 1,
   an integrated circuit chip,
   the output members being disposed in a centroidal arrangment on the integrated circuit chip to minimize errors resulting from deviations in the characteristics of the output members at different positions on the integrated circuit chip.

4. In a combination as set forth in claim 2,
   the individual output members associated with each of the control lines in the second group being disposed in a centroidal relationship in accordance with the binary significance of such individual output members relative to the other output members in the second group to minimize errors resulting from deviations in the characteristics of such output members at different positions on the integrated circuit chip.

5. In combination for providing a conversion between binary and analog values, a plurality of first control lines disposed in a substantially parallel relationship, means for providing for a selection of individual ones of the first control lines dependent upon the binary value to be converted, a plurality of output members each constructed to provide a particular current upon being energized, the output members being disposed in a substantially parallel relationship with the first control lines, a plurality of second control lines disposed in a substantially parallel relationship with the first control lines and the output members, the second control lines having a different representation than the first control lines, particular ones of the output members being coupled to individual combinations of the first and second control lines in accordance with the binary value represented by such particular one of the output members, and means for energizing the output members associated with the individual combinations of the first and second control lines upon the selection of such individual combinations of the first and second control lines.

6. In combination for providing a conversion between binary and analog values, a plurality of first control lines disposed in a substantially parallel relationship, means for providing for a selection of individual ones of the first control lines dependent upon the binary value to be converted, a plurality of output members each constructed to provide a particular current upon being energized, the output members being disposed in a substantially parallel relationship with the first control lines, a plurality of second control lines disposed in a substantially parallel relationship with the first control lines and the output members, particular ones of the output members being coupled to individual combinations of the first and second control lines, and means for energizing the output members associated with the individual combinations of the first and second control lines upon the selection of such individual combinations of the first and second control lines and in accordance with the progressive increases in the binary value, the output members being disposed in a pair of spaced columns between the first and second control lines and each of the first control lines being operative to provide for a thermometer relationship in the count of the binary values and the second control lines being operative to provide for a binary relationship in such count.

7. In a combination as set forth in claim 6, an integrated circuit chip, the first and second control lines and the output members being disposed on the integrated circuit chip, and means disposed on the integrated chip and responsive to the energizing of each individual one of the first control lines for providing for the energizing of the output members associated with the first control lines of a lower order in the thermometer relationship than such individual one of the first control lines.

8. In a combination as set forth in claim 7, the output members in the columns being operative in ranges each having an individual binary significance corresponding to the significance of an individual one of the first control lines in the thermometer relationship and the output members in each range being disposed in a centroidal relationship and the output members in the different ranges being disposed in a centroidal relationship relative to one another.

9. In a combination as set forth in claim 7, wherein the output members in the columns are disposed in groups and wherein the output members in each range are energized on a centroidal basis in accordance with the selection of each individual combination of the first and second control lines and in accordance with the binary significance of the progressive increments in the binary values within such range.

10. In combination for providing a conversion between binary and analog values, a plurality of first means for providing a plurality of first controls each operative in a thermometer relationship with respect to the others of the first means, a plurality of second means for providing a plurality of second controls operative in a binary relationship, third means for selectively activating individual combinations of the first and second means in accordance with the binary value to be converted to the analog value, a plurality of output members each constructed to provide a particular current when energized, each of the output members being coupled to an individual combination of the first and second control means, fourth means for providing for the energizing of individual ones of the output members associated with the selectively activated combination of the first and second control means in accordance with the binary value to be converted to the analog value, and fifth means responsive to the selective activation of the individual combinations of the first and second control means for providing for the energizing of the output members having a binary significance less than the individual output members energized by the individual combinations of the first and second control means, the output members associated with the activation of each individual one of the first means and the different combinations of the second means being disposed in a centroidal relationship to one another and being disposed in a centroidal relationship to the output members associated with the activation of each of the other ones of the first means and the different combinations of the second means.

11. In a combination as recited in claim 10, an output line connected to the output members to provide an output current constituting an accumulation of the currents in the output members energized at each instant.

12. In a combination as st forth in claim 11, means for providing, for increasing binary values, for the continued energizing of the output members indicative of lower binary values than such increasing binary values.

13. In a combination as set forth in claim 12, an integrated circuit chip holding the output members and the pluralities of the first and second means, each of the first means including a plurality of first lines and each of the second means including a plurality of second lines.

14. In a combination as set forth in claim 13, the plurality of first lines and the plurality of second lines being disposed in a parallel relationship.

15. In combination for providing a conversion between binary and analog values, a plurality or output members each operative to pass a particular current when energized, a plurality of first means associated with the output members in a thermometer relationship for activating an individual one of the first means in the plurality in accordance with the binary value to be converted to the analog value to obtain an activation of a group of output members associated with such individual one of the first means, second means associated with the output members in a binary relationship for energizing individual ones of the output members in the activated group in accordance with the binary value to be converted to the analog value, and third means associated with the first and second means and the output members for energizing at each instant the output members in the groups of lower binary significance than the group activated by the individual one of the first means, the output members in each group being disposed in a first centroidal relationship to one another and the output members in each group being disposed in a second centroidal relationship to the output members in the other groups.

16. In a combination as set forth in claim 15, an integrated circuit chip, the output members being disposed on the integrated circuit chip to provide the first centroidal relationship of the output members within each group activated by the first means and the second centroidal relationship between the different groups of the output members to minimize any errors in the analog value as a result of differences in the characteristics of the output members at different positions on the integrated circuit chip.

17. In a combination as set forth in claim 16, the output members being disposed on the integrated circuit chip in a pair of spaced columns and the pluralities of first and second means being disposed in the space between the pair of spaced columns in the same columnar relationship as the output members.

18. In a combination as set forth in claim 17, the plurality of first means constituting a first plurality of lines and the plurality of second means constituting a second plurality of lines.

19. In a combination as set forth in claim 18, the lines in the first and second pluralities being substantially parallel and the lines in the first plurality providing a thermometer code and the lines in the second plurality providing a binary code and the output members being responsive at each instant to an individual one of the first means and an individual combination of the second means.

20. In combination for converting binary indications into analog indications, first means for providing the binary indications, second means responsive to the binary indications and connected in a thermometer relationship for becoming individually activated for successive ranges of binary values, third means responsive to the binary indications and connected in a binary relationship for becoming activated in accordance with the different binary values in each range, a plurality of output members disposed in a first direction at spaced positions in a second direction, fourth means associated with individual combinations of the first means and the second means for energizing individual ones of the output members in accordance with the binary indications provided by such individual combinations, fifth means for maintaining at each instant the energizing of the output members in ranges lower in value than the range of the output members energized at such instant by the individual combination of the first means and the second means, and sixth means for providing a common output from the output members energized at each instant, the output members in each range being disposed in a centroidal relationship to one another in the first direction with first and second such groups of such output members being displaced from each other in a symmetrical relationship in a second direction transverse to the first direction and the output members in the different groups being disposed in a centroidal relationship to one another in the first direction and being disposed in a symmetrical relationship to one another in the second direction.

21. In a combination as set forth in claim 20 wherein the plurality of second means includes a plurality of first lines connected in a thermometer code and wherein the plurality of third means includes a plurality of second lines connected in a binary code and wherein the first and second lines are disposed in the first direction in spaced relationship to one another in the second direction.

22. In a combination as set forth in claim 21 wherein the output members in each of the first and second groups in each range are interleaved relative to one another in the first direction and are displaced in the first and second directions relative to the output members in the other group in such range.

23. In a combination as set forth in claim 22, the output members in each individual range being displaced in the first direction from the output members in the range of adjacent binary significance to such individual range to provide a symmetrical relationship between such adjacent groups.

* * * * *